(12) United States Patent
Choi

(10) Patent No.: US 8,076,743 B2
(45) Date of Patent: Dec. 13, 2011

(54) IMAGE SENSOR

(75) Inventor: Ha Kyu Choi, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 122 days.

(21) Appl. No.: 12/647,708

(22) Filed: Dec. 28, 2009

(65) Prior Publication Data

US 2010/0164038 A1 Jul. 1, 2010

(30) Foreign Application Priority Data

Dec. 31, 2008 (KR) .......................... 10-2008-0138874

(51) Int. Cl.
*H01L 31/0232* (2006.01)
*H01L 31/02* (2006.01)

(52) U.S. Cl. ................ 257/432; 257/446; 257/E31.127; 257/E31.11; 438/69; 438/70; 438/71; 438/72

(58) Field of Classification Search .............. 438/69–72, 438/783; 257/432, 446, E31.11, E31.127, 257/440, E27.134
See application file for complete search history.

(56) References Cited

U.S. PATENT DOCUMENTS

| | | | |
|---|---|---|---|
| 6,379,992 B2 * | 4/2002 | Jo .................................... | 438/70 |
| 7,166,484 B2 * | 1/2007 | Lee .................................. | 438/29 |
| 2006/0060899 A1 * | 3/2006 | Hong et al. .................... | 257/294 |
| 2008/0296713 A1 * | 12/2008 | Lee et al. ....................... | 257/432 |

* cited by examiner

*Primary Examiner* — N Drew Richards
*Assistant Examiner* — Mamadou Diallo
(74) *Attorney, Agent, or Firm* — Saliwanchik, Lloyd & Eisenschenk

(57) ABSTRACT

Embodiments relate to an image sensor and a method of manufacturing the image sensor. An image sensor according to the embodiment includes: silicon patterns that are formed on a flexible substrate; a device isolation pattern that is formed between the silicon patterns; a circuit layer that is formed on the silicon patterns and has a first isolation pattern directly connected with the device isolation pattern; and a wiring layer that is formed on the circuit layer and includes a second isolation pattern corresponding to the first isolation pattern, and a wiring electrically connected with the circuit layer. The embodiments provide a flexible image sensor that can be applied to a variety of products and a method of manufacturing the flexible image sensor.

9 Claims, 5 Drawing Sheets

IMAGE SENSOR

CROSS-REFERENCE TO RELATED APPLICATION

This application claims the benefit under 35 §U.S.C. 119 of Korean Patent Application No. 10-2008-0138874, filed Dec. 31, 2008, which is hereby incorporated by reference in its entirety.

BACKGROUND

New electronic devices have been provided and have come into wide use to individuals and homes with the decrease in price of industrial devices due to technical innovation. In addition, recently, rapid progress of the informatization technology has introduced an age of ubiquitous computing that allows for contacting information anytime and anywhere.

Accordingly, technologies of network, internet, digital content, mobile information devices, multimedia, and wire/wireless communication are integrated and new devices that cannot be defined by the existing conception have been gradually developed.

Active researches on next generation flexible displays that can replace the existing displays have been made by the needs of the times and social necessity.

However, the CMOS image sensors included in wafers have difficulty in implementing flexible image sensors, because the wafers are large in thickness and are hard.

BRIEF SUMMARY

Embodiments are intended to provide a flexible image sensor that can be applied to a variety of products.

An image sensor according to an embodiment includes: silicon patterns that are formed on a flexible substrate; a device isolation pattern that is formed between the silicon patterns; a circuit layer that is formed on the silicon patterns and has a first isolation pattern directly connected with the device isolation pattern; and a wiring layer that is formed on the circuit layer and includes a second isolation pattern corresponding to the first isolation pattern and a wiring electrically connected with the circuit layer.

An image sensor according to an embodiment includes: silicon patterns that are formed on a flexible substrate; a device isolation pattern that is formed between the silicon patterns; a reflective pattern that is formed between a portion of the silicon patterns and the flexible substrate; a circuit layer that is formed on the silicon patterns and has a first isolation pattern directly connected with the device isolation pattern; and a wiring layer that is formed on the circuit layer and includes a second isolation pattern corresponding to the first isolation pattern and a wiring electrically connected with the circuit layer.

An image sensor according to an embodiment includes: a substrate; silicon patterns that are separated by photodiodes on the substrate; a device isolation pattern that is formed between the silicon patterns; a circuit layer that is formed on the silicon patterns; and a wiring layer that is formed on the circuit layer.

DETAILED DESCRIPTION

Figure 1:
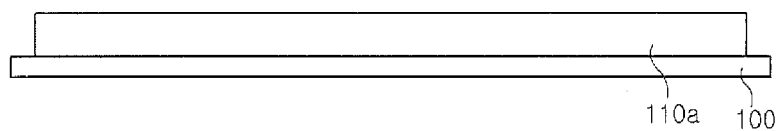
FIGS. 1 to 6 are cross-sectional views illustrating a process of manufacturing an image sensor according to a first embodiment.

An image sensor according to embodiments and methods of manufacturing the image sensor are described in detail with reference to the accompanying drawings.

In the description of embodiments, it will be understood that when a layer (or film) is referred to as being 'on/over' another layer or substrate, it can be directly on/over another layer or substrate, or intervening layers may also be present.

The thickness or size of each layer may be exaggerated, omitted, or schematically shown in the drawings for the convenience and clarity of description. Further, it should be understood that the size of each component does not particularly represent the actual size.

FIGS. 1 to 6 are cross-sectional views illustrating a process of manufacturing an image sensor according to a first embodiment.

Referring to FIG. 1, a flexible substrate 100 is provided.

The flexible substrate 100 may be a glass substrate or a plastic substrate.

The flexible substrate 100, for example, may be a (polyethylene terphthalate PET) or a polycarbonate (PC) substrate.

The flexible substrate 100 may be film that is manufactured thin enough to have flexibility.

A silicon substrate 110a is bonded on the flexible substrate 100.

Therefore, an adhesive may be interposed between the flexible substrate 100 and the silicon substrate 110a.

The silicon substrate 110a is manufactured in a thickness of 2~10 μm.

Figure 2:
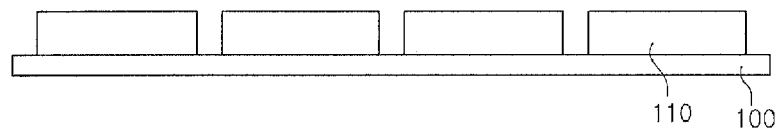

Referring to FIG. 2, a photoresist pattern or a hard mask is formed on the silicon substrate 110a, and trenches exposing the flexible substrate 100 are formed by etching the silicon substrate 110a, using the photoresist pattern as a mask. Accordingly, silicon patterns 110 spaced apart from each other are formed.

The trenches may be formed along the pixel region boundary. Further, the trench may be formed along the periphery of a photodiode region.

The trenches may be formed between transistors.

The silicon substrate is isolated into silicon patterns 110 by the trenches. The silicon patterns 110 provide active regions.

Figure 3:
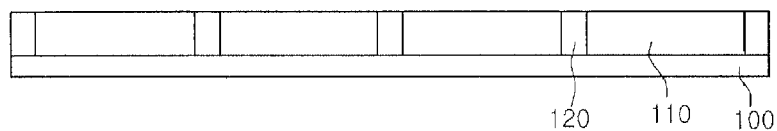

Next, referring to FIG. 3, a high density polymer layer is formed on the flexible substrate 100, covering the silicon patterns 110 and gap-filling the trenches.

The upper surface of the silicon patterns is exposed by chemically-mechanically polishing the high density polymer layer, thereby forming device isolating patterns 120 in the trenches.

The high density polymer layer is made of an elastic material, which can extend horizontally with respect to the silicon substrate when bending and then contract to return to the initial state.

Figure 4:
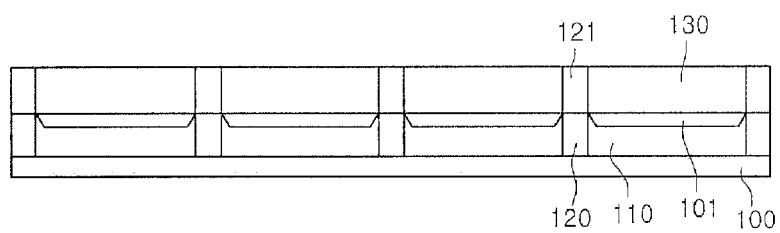

Referring to FIG. 4, photodiodes 101 are formed by implanting dopant into photodiode regions in the silicon patterns 110. Further, circuit layers 130 are formed by forming transistors for processing signals generated by the photodiodes 101, on the patterned silicon pattern 110.

As a method of forming the photodiode 101, not only the method of ion-implanting dopant, but a cleaving technique of implanting dopant at the atomic level by creating microscopic cracks in the silicon pattern 110 may be used.

In this configuration, an STI (shallow trench isolation) pattern can be partially formed by forming trenches to a predetermined depth in the silicon substrate and gap-filling an isolation material into the trenches. The STI pattern can be used to isolate microscopic devices that are not isolated by device isolation patterns 120. For example, the STI pattern may be formed on the silicon patterns 110 to isolate devices between transistors.

The photodiodes 101 and the transistors may be formed on different silicon patterns 110.

The circuit layer 130 includes the photodiode 101, the transistors, and dielectric layers formed on them.

The transistors can include at least one of a transfer transistor, a reset transistor, a drive transistor, and a select transistor.

A trench corresponding to the device isolation pattern 120 is formed in the dielectric layer of the circuit layer 130, and a first isolation pattern 121 connected with the device isolation pattern is formed by gap-filling the high density polymer in the trench.

Figure 5:
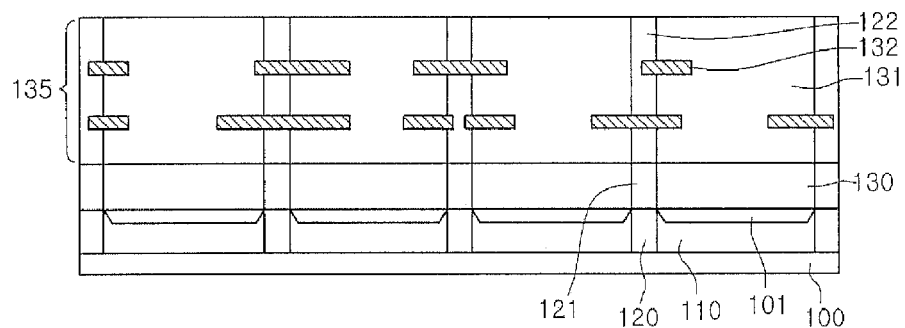

Referring to FIG. 5, a wiring layer 135 is formed on the circuit layer 130 formed with the first isolation pattern 121.

The wiring layer 135 includes a plurality of interlayer dielectric layers 131 and wirings 132 formed between the interlayer dielectric layers 131.

The wirings 132 are disposed in consideration of light paths through which light is detected by the photodiodes 101.

That is, the wirings 132 electrically connected with the circuit layer 130 are formed corresponding to regions other than where the photodiodes 101 are formed.

The wirings 132 may be formed on the first isolation pattern 131.

The wiring 132 may be made of carbon nanotubes. The wiring 132 may be made of a conductive polymer. The carbon nanotubes and the conductive polymer have elasticity, such that they can be applied to a flexible image sensor according to an embodiment.

In the plurality of interlayer dielectric layers 131, one interlayer dielectric layer 131 is formed and then a trench corresponding to the first isolation pattern 121 is formed on the interlayer dielectric layer 131, and a second isolation pattern 122 is formed by gap-filling the high density polymer to contact with the first isolation pattern 121 in the trench. Further, the wiring 132, which can be made of carbon nanotubes (or conductive polymer), is formed on the interlayer dielectric layer 131. The wiring layer 135 including the interlayer dielectric layers 131, the second isolation patterns 122, and the wirings 132 is formed by repeating the above processes.

As a result, the device isolation patterns 120 that isolate the silicon patterns 110 are formed on the flexible substrate 100, the first isolation patterns 121 directly connected with the device isolation patterns 120 are formed on the circuit layer 130, and the second isolation patterns 122 directly connected to the interlayer dielectric layers 131 on the first isolation patterns 121 are formed.

Figure 6:
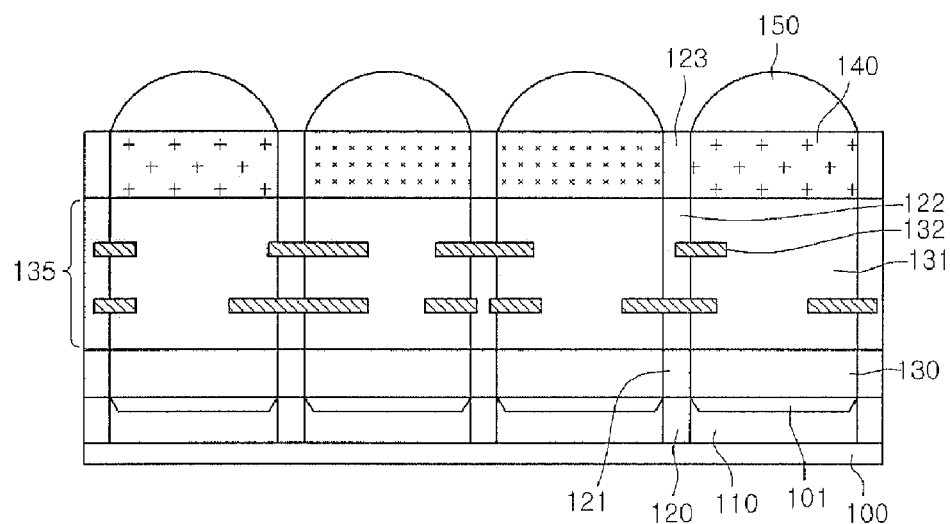

As shown in FIG. 6, a color filter 140 is formed over each of the photodiode 101.

The color filter 140 can include a red color filter, a blue color filter, and a green color filter, and a third isolation pattern 123 can be formed by gap-filling high density polymer between the color filters.

Though not shown, a passivation layer may be formed on the wiring layer 135. The passivation layer can include at least one of a silicon nitride layer and a silicon oxide layer. The third isolation pattern 123 directly connected with the second isolation pattern 122 may be formed on the passivation layer.

In a specific embodiment, a red color filter is formed over a corresponding photodiode by forming a red color layer on the wiring layer 135 and selectively exposing and developing the red color filter layer. In this way, a green color filter and a blue color filter are formed over corresponding photodiodes on the wiring layer. The process order of the red, green, and blue color filters can be combined and changed in various ways.

The blue color filter, the red color filter, and the green color filter are formed spaced apart from each other.

The color filters may be formed by paints or polymer material including dye.

The third isolation pattern 123 directly connected with the second isolation pattern 122 is formed at the boundary of the blue color filter, the red color filter, and the green color filter by forming and polishing a high density polymer on the blue color filter, the red color filter, and the green color filter.

Next, a microlens 150 can be formed on the blue color filter, the red color filter, and the green color filter.

The color filter 140 and the microlens 150 are selective components and may be removed in accordance with the design and product.

When the image sensor manufactured according to FIGS. 1 to 6 bends, the device isolation pattern 120, first isolation pattern 121, second isolation pattern 122, and third isolation pattern 123 vertically stacked on the flexible substrate 100 extend in the bending direction, such that it is possible to implement a flexible image sensor.

The device isolation pattern 120 and the first to third isolation patterns 121, 122, and 123 are made of high density polymer and can extend in the bending direction for the characteristics of the high density polymer.

Figure 7:
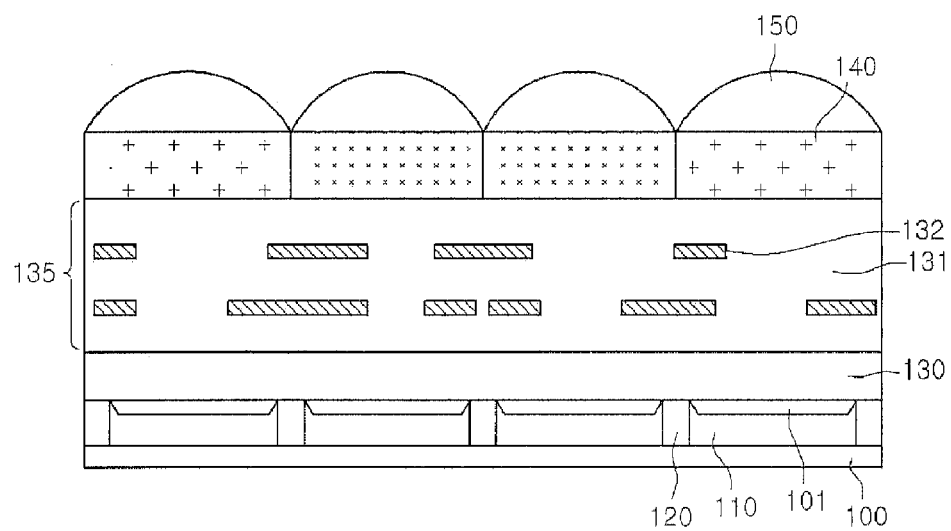
FIG. 7 is a cross-sectional view showing an image sensor manufactured by a second embodiment.

FIG. 7 is a cross-sectional view showing an image sensor manufactured by a second embodiment.

According to the second embodiment, in a flexible image sensor, the dielectric layer of the circuit layer 130 and the interlayer dielectric layer 131 can be made of transparent high density polymer, without forming the first to third isolation patterns 121, 122, and 123 on each layer. Further, the wiring 132 may be made of carbon nanotubes or a conductive polymer. Further, the color filter 140 may be made of a polymer material including dye. Further, the microlens 150 may be made of extensible transparent high density polymer.

Accordingly, it is possible to manufacture a flexible image sensor using a simple process.

FIGS. 8 to 13 are cross-sectional views illustrating a process of manufacturing an image sensor according to a third embodiment.

It is possible to understand the configuration that is not described in detail in the third embodiment, with reference to the first and second embodiments.

Figure 8:
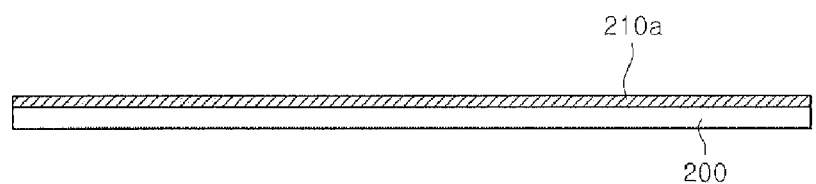
FIGS. 8 to 13 are cross-sectional views illustrating a process of manufacturing an image sensor according to a third embodiment.

Referring to FIG. 8, a reflective layer 210a is formed on a flexible substrate 200.

The reflective layer 210a is made of a material that can reflect incident light on its surface back towards the front surface. For example, the reflective layer 210a may be formed of a thin aluminum layer.

Figure 9:
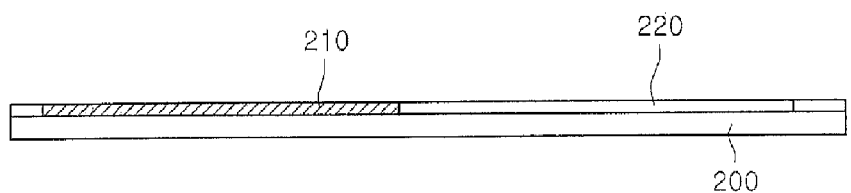

Referring to FIG. 9, a reflection pattern 210 is formed by patterning the reflective layer 210a.

The reflection pattern 210 is formed to correspond to a photodiode region. The reflection pattern 210 is provided to improve light efficiency and sensitivity by reflecting permeating light to travel to the photodiode.

A planarizing layer 220 is formed to planarize the reflective pattern 200 where the reflective pattern 210 is formed. The planarizing pattern 220 may be made of various dielectric materials including high density polymer.

The planarizing layer 220 may be formed on the front surface while covering the reflective pattern 210. However, in the embodiment shown in FIG. 9, the planarizing layer 220 may be formed by polishing until the reflective pattern 210 is exposed.

Figure 10:
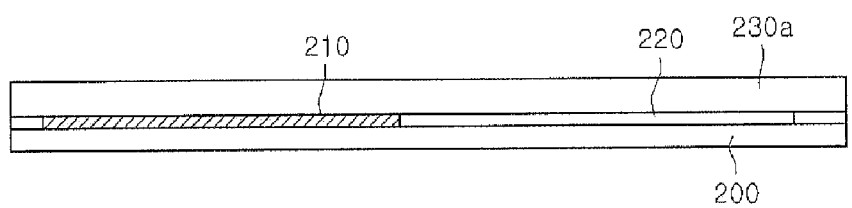

Referring to FIG. 10, a silicon substrate 230a is bonded on the flexible substrate 200 formed with the planarizing layer 220 and the reflective pattern 210.

Therefore, an adhesive member may be formed between the planarizing layer 220 and the reflective pattern 210, and the silicon substrate 230a.

Figure 11:
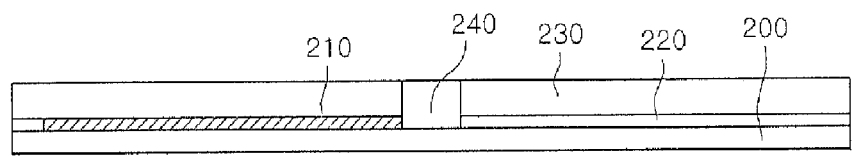

Referring to FIG. 11, a trench passing through the silicon substrate 230a and/or the planarizing layer 220 can be formed. The trench may be formed along the pixel boundary. The trench may be formed along the photodiode region boundary.

A high density polymer can be formed on the front surface of the silicon substrate 230a where the trench is formed, such that a gap-filled device isolation pattern 240 can be formed in the trench.

The device isolation pattern 240 is formed to electrically isolate the photodiode region and a device region. Further, the device isolation pattern 240 can divide the silicon substrate 230a into silicon patterns 230, which are device forming regions, in order for the silicon substrate 230a to flexibly bend.

Figure 12:
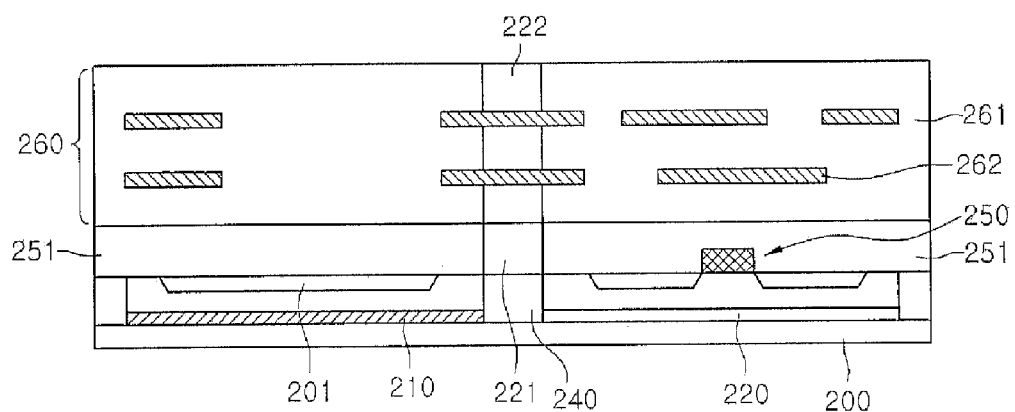

Referring to FIG. 12, a photodiode 201 can be formed on the silicon pattern 230 divided by the device isolation pattern 240. Further, a transistor 250 may be formed on another silicon pattern 230.

A circuit layer 251 including the transistors 250 and a dielectric layer covering the transistors is formed on the silicon patterns 230 and the device isolation pattern 240.

The dielectric layer has a trench corresponding to the device isolation pattern 240 and a first isolation pattern 221 is formed in the trench by gap-filling a high density polymer.

A wiring layer 260 including interlayer dielectric layer 261 and wirings 262 electrically connected with the circuit layer 251 is formed on the circuit layer 251 formed with the first isolation pattern 221.

The wiring 262 may be made of a conductive polymer or carbon nanotubes.

The interlayer dielectric layer 261 has a second isolation pattern 222 that is formed to be directly connected with the first isolation pattern 221, by performing processes of forming each layer, forming a trench corresponding to the first isolation pattern 221, and gap-filling a high density polymer. The second isolation pattern 222 connected with the first isolation pattern 221 is formed in the wiring layer by repeating the processes every time each interlayer dielectric layer 261 of the wiring layer 260 is formed.

The second isolation pattern 222 is formed to the uppermost interlayer dielectric layer 261 of the wiring layer 260 through the interlayer dielectric layers of the wiring layer 260 while contacting with the first isolation pattern 221.

Figure 13:
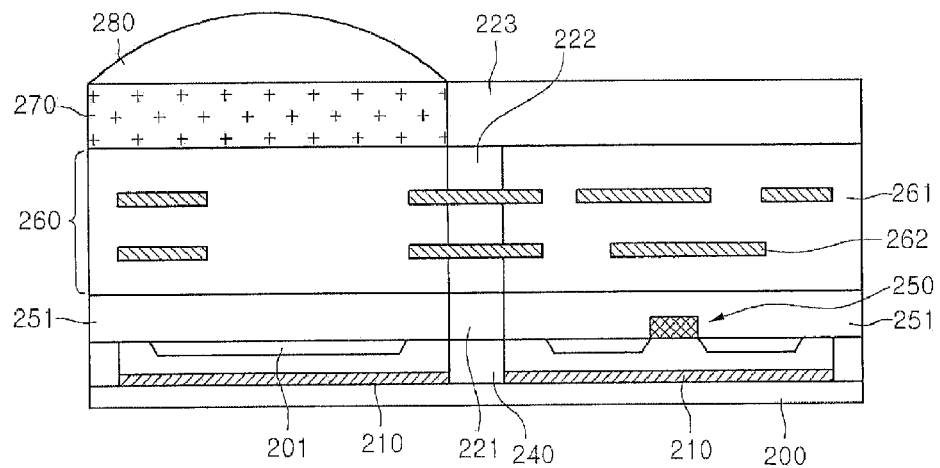
Figure 14:
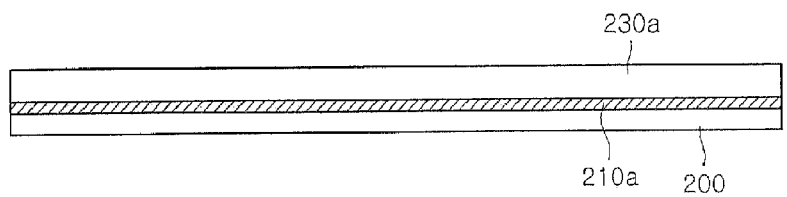
FIGS. 14 to 17 are cross-sectional views illustrating a process of manufacturing an image sensor according to a fourth embodiment.
Figure 15:
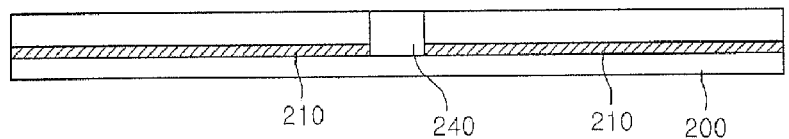
Figure 16:
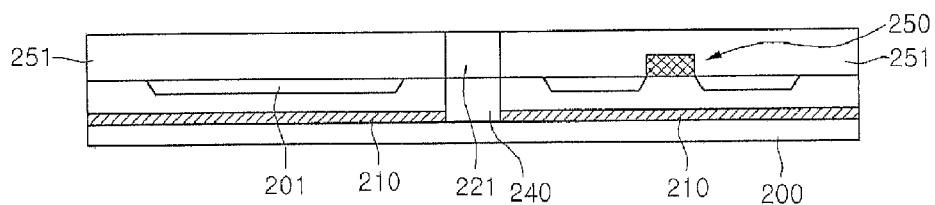
Figure 17:
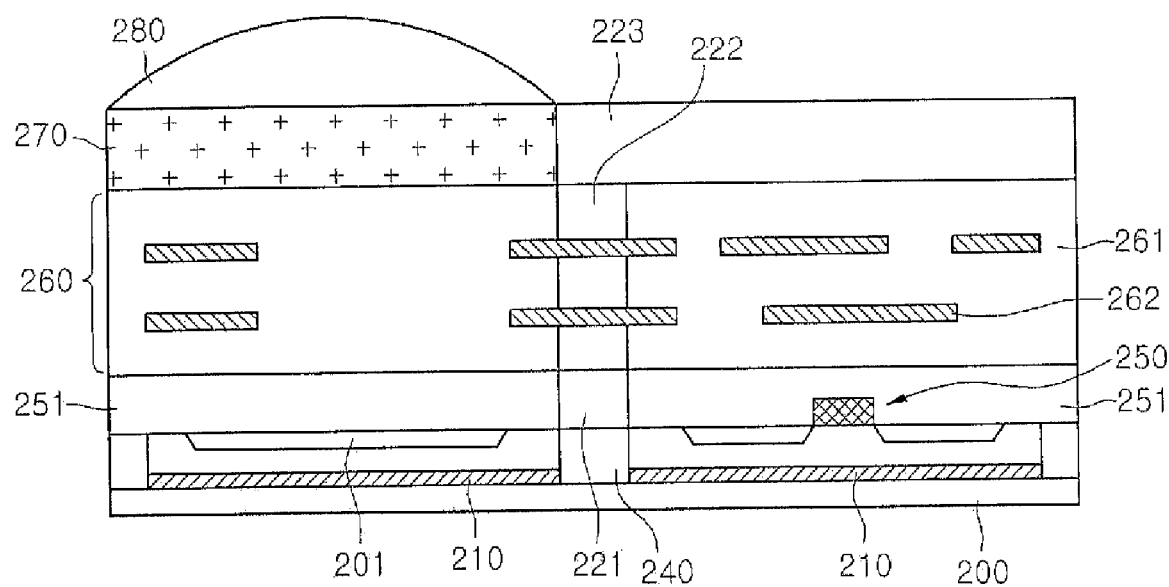

Referring to FIG. 13, a color filter 270 is formed at a position corresponding to the photodiode region 201 on the wiring layer 260.

The color filter 270 includes red, blue, and green color filters, which are spaced apart from each other, and a third isolation pattern 223 directly connected with the second isolation pattern is formed by gap-filling high density polymer into the spaced gap.

The color filter 270 may be formed of a photosensitive layer including dye and may be made of high density polymer including dye.

A microlens 280 is formed on the color filter 270.

Accordingly, as the device isolation pattern 240, first isolation pattern 221, second isolation pattern 222, and third isolation pattern 223 vertically stacked on the flexible substrate 200 extend in a bending direction, a flexible image sensor can be implemented.

The device isolation pattern 240 and the first and third isolation patterns 221, 222, and 223 are made of a high density polymer and can extend in the bending direction for the characteristics of the high density polymer.

FIGS. 14 to 17 are cross-sectional views illustrating a process of manufacturing an image sensor according to a fourth embodiment.

Referring to FIGS. 14 to 17, a reflective layer 210a is formed on a flexible substrate 200, and a silicon substrate 230a is bonded on the reflective layer 210a.

An adhesive member may be formed between the silicon substrate 230a and the reflective layer 210a.

A trench can be formed by etching the silicon substrate 230a and the reflective layer 210a.

The trench may be formed along the pixel boundary and the photodiode boundary, and may be formed to isolate transistors.

A reflective pattern 210 and a silicon pattern 230 on the reflective pattern 210 can be formed by forming a photoresist pattern or a hard mask and then etching the silicon substrate 230a and the reflective layer 210a, using the hard mask as an etching mask.

The silicon pattern 230 is a device region and where photodiodes or transistors can be formed.

A device isolation pattern 240 gap-filled in the trench is formed by forming and polishing a high density polymer on the front surfaces of the silicon patterns 230 where the trench is formed.

Subsequently, a circuit layer 251 is formed on the silicon patterns 210 by forming the photodiodes 210 or the transistors 250 on the silicon patterns 210.

A first isolation pattern 221 is formed in the circuit layer 251 corresponding to the device isolation pattern 240.

A method of forming the first isolation pattern 221 is the same as that described in the third embodiment.

Subsequently, a wiring layer 260 is formed on the circuit layer 251, a color filter 270 corresponding to the photodiode 201 is formed on the wiring layer 260, and a microlens 280 is formed on the color filter 270.

As described above, a second isolation pattern 222 connected with the first isolation pattern 221 is formed in the wiring layer 260 and a third isolation pattern 223 connected with the second isolation pattern 222 is formed around the color filter 270.

The first to third isolation patterns 221, 222, and 223 provide the image sensor with flexibility by being connected with each other. That is, as the flexible substrate 100 bends, the device isolation pattern 240 and the first to third isolation patterns 221, 222, and 223 extend in the bending direction, such that bending can be generated throughout the image sensor.

Incident light through the microlens 280 travels to the photodiode 201 formed over the silicon pattern 210 through the color filter 270 and the wiring layer 260. The light traveling to the photodiode 201 travels to the reflective pattern through the silicon pattern, and the light reflected on the reflective pattern travels again to the photodiode 201, thereby improving light efficiency.

The light traveling to the silicon pattern 210 where the transistors 250 are formed is blocked by the wirings 262 formed in the wiring layer 260, such that it is possible to inhibit noise from being generated by the reflective pattern 210 formed under the transistors 250. Further, a light blocking layer may be provided to the wiring layer 260 to inhibit light from traveling to undesired region For example, a metal pattern may be formed over the silicon pattern 210 where the transistors 250 are formed, or a light blocking pattern may be made of a light absorption material or light reflection material.

A method of manufacturing an image sensor according to an embodiment includes: bonding a silicon substrate onto a flexible substrate; forming silicon patterns by patterning the silicon substrate; fowling a device isolation pattern by gap-filling high density polymer between the silicon patterns; forming a circuit layer including photodiode regions at a portion of the silicon patterns and transistors at other portions of the silicon patterns; forming a first isolation pattern directly connected with the device isolation pattern, in the circuit layer; forming a interlayer dielectric layer on the circuit layer; forming a second isolation pattern connected with the first isolation pattern in the interlayer dielectric layer; and forming a wiring electrically connected with the circuit layer on the interlayer dielectric layer.

A wiring layer can be formed on the circuit layer by repeating the process of forming an interlayer dielectric layer, an isolation pattern, and wiring. Further, color filters can be formed corresponding to the photodiode regions, and isolation patterns are included stacked in the device.

The forming of the device isolation pattern includes: forming a high density polymer on the silicon patterns; and exposing the upper surface of the silicon pattern by polishing the high density polymer.

The flexible substrate is characterized by being one of glass or plastic.

A method of manufacturing an image sensor according to an embodiment includes: forming a reflective pattern on a flexible substrate; bonding a silicon substrate on the flexible substrate formed with the reflective pattern; forming silicon patterns by patterning the silicon substrate; forming a device isolation pattern by gap-filling a high density polymer between the silicon patterns; forming a circuit layer including photodiode regions at a portion of the silicon patterns and transistors at other portions of the silicon patterns; forming a first isolation pattern directly connected with the device isolation pattern in the circuit layer; forming a interlayer dielectric layer on the circuit layer; forming a second isolation pattern connected with the first isolation pattern in the interlayer dielectric layer; and forming a wiring electrically connected with the circuit layer on the interlayer dielectric layer.

The reflective pattern is formed under the silicon patterns corresponding to where the photodiode regions are formed.

After forming the reflective pattern, a planarizing layer can be formed on the flexible substrate.

In addition, a wiring layer can be formed on the circuit layer by repeating the process of forming an interlayer dielectric layer, an isolation pattern, and wiring. Further color filters can be formed corresponding to the photodiode regions, and isolation patterns are included stacked in the device.

The forming of the device isolation pattern includes: forming a high density polymer on the silicon patterns; and exposing the upper surface of the silicon patterns by polishing the high density polymer.

The wiring layer including a second isolation pattern corresponding to the first isolation pattern and the wiring electrically connected with the circuit player can be included.

The flexible substrate is formed of glass or plastic.

A method of manufacturing an image sensor according to an embodiment includes: forming a reflective layer on a flexible substrate; bonding a silicon substrate on the reflective layer; forming reflective patterns and silicon patterns by patterning the silicon substrate and the reflective layer; forming a device isolation pattern by gap-filling a high density polymer between the silicon patterns; forming a circuit layer including photodiode regions at a portion of the silicon patterns and transistors at other portions of the silicon patterns; forming a first isolation pattern directly connected with the device isolation pattern in the circuit layer; forming a interlayer dielectric layer on the circuit layer; forming a second isolation pattern connected with the first isolation pattern in the interlayer dielectric layer; and forming a wiring electrically connected with the circuit layer on the interlayer dielectric layer.

A wiring layer can be formed on the circuit layer by repeating the process of forming an interlayer dielectric layer, an isolation pattern, and wiring. Further, color filters can be formed corresponding to the photodiode regions, and isolation patterns can be stacked throughout the device.

The forming of the device isolation pattern includes: forming a high density polymer on the silicon patterns; and exposing the upper surface of the silicon patterns by polishing the high density polymer.

A wiring layer including a second isolation pattern corresponding to the first isolation pattern and the wiring electrically connected with the circuit player can be included.

The embodiments described above are not limited to the particularly described embodiments and drawings, and it will be apparent to those skilled in the art that the present embodiments can be replaced, changed, and modified in various ways without departing from the scope of the invention.

It should be understood that the examples and embodiments described herein are for illustrative purposes only and that various modifications or changes in light thereof will be suggested to persons skilled in the art and are to be included within the spirit and purview of this application.

What is claimed is:

1. An image sensor comprising:
silicon patterns formed on a flexible substrate;
a device isolation pattern formed between the silicon patterns;
a reflective pattern formed between a portion of the silicon patterns and the flexible substrate;
a circuit layer formed on the silicon patterns and having a first isolation pattern directly connected with the device isolation pattern; and
a wiring layer formed on the circuit layer and including a second isolation pattern corresponding to the first isolation pattern and a wiring electrically connected with the circuit layer.

2. The image sensor according to claim 1, wherein the circuit layer includes photodiodes formed at a portion of the silicon patterns.

3. The image sensor according to claim 1, wherein the circuit layer includes transistors formed on a portion of the silicon patterns.

4. The image sensor according to claim 3, further comprising a planarizing layer formed between the silicon patterns and the flexible substrate.

5. The image sensor according to claim 4, wherein the planarizing layer is disposed below regions of the silicon patterns where the transistors are formed, and wherein the reflective layer is disposed below other regions of the silicon patterns.

6. The image sensor according to claim 1, wherein the device isolation pattern, the first isolation pattern, and the second isolation pattern include a high density polymer.

7. The image sensor according to claim 1, wherein the device isolation pattern, the first isolation pattern, and the second isolation pattern are vertically stacked with respect to the flexible substrate.

8. The image sensor according to claim 1, wherein the wiring includes at least one of a conductive polymer and carbon nanotubes.

9. The image sensor according to claim 1, further comprising:
    color filters formed on the wiring layer; and
    a third isolation pattern formed between the color filters and connected with the second isolation pattern.

* * * * *